(12) United States Patent
Kim et al.

(10) Patent No.: US 8,828,890 B2
(45) Date of Patent: Sep. 9, 2014

(54) METHOD FOR DEPOSITING CYCLIC THIN FILM

(75) Inventors: Hai Won Kim, Gyeonggi-do (KR); Sang Ho Woo, Gyeonggi-do (KR)

(73) Assignee: Eugene Technology Co., Ltd., Gyeonggi-do (KR)

( * ) Notice: Subject to any disclaimer, the term of this patent is extended or adjusted under 35 U.S.C. 154(b) by 0 days.

(21) Appl. No.: 13/808,926

(22) PCT Filed: Aug. 1, 2011

(86) PCT No.: PCT/KR2011/005649
§ 371 (c)(1),
(2), (4) Date: Jan. 8, 2013

(87) PCT Pub. No.: WO2012/018210
PCT Pub. Date: Feb. 9, 2012

(65) Prior Publication Data
US 2013/0115783 A1    May 9, 2013

(30) Foreign Application Priority Data
Aug. 2, 2010    (KR) .......................... 10-2010-0074605

(51) Int. Cl.
*H01L 21/02* (2006.01)
*C23C 16/34* (2006.01)
*C23C 16/40* (2006.01)
*C23C 16/455* (2006.01)

(52) U.S. Cl.
CPC .... *H01L 21/02271* (2013.01); *H01L 21/02274* (2013.01); *H01L 21/0262* (2013.01); *C23C 16/345* (2013.01); *C23C 16/401* (2013.01); *H01L 21/02219* (2013.01); *H01L 21/02211* (2013.01); *H01L 21/02532* (2013.01); *H01L 21/0217* (2013.01); *H01L 21/02164* (2013.01); *H01L 21/0228* (2013.01); *C23C 16/4554* (2013.01)
USPC .......................................... 438/788; 438/792

(58) Field of Classification Search
None
See application file for complete search history.

(56) References Cited

U.S. PATENT DOCUMENTS

| | | | |
|---|---|---|---|
| 2008/0038936 A1* | 2/2008 | Todd et al. | ..................... 438/787 |
| 2009/0041952 A1  | 2/2009 | Yoon et al. | |
| 2009/0311857 A1* | 12/2009 | Todd et al. | ..................... 438/591 |

FOREIGN PATENT DOCUMENTS

| KR | 10-2002-0081902 A | 10/2002 |
|---|---|---|
| KR | 10-2007-0055898 A | 5/2007 |
| KR | 10-2009-0016403 A | 2/2009 |

* cited by examiner

*Primary Examiner* — Charles Garber
*Assistant Examiner* — Stanetta Isaac
(74) *Attorney, Agent, or Firm* — Rabin & Berdo, P.C.

(57) ABSTRACT

Provided is a method of depositing a cyclic thin film that can provide excellent film properties and step coverage. The method comprises the steps of forming a silicon thin film by repeating a silicon deposition step for depositing silicon on a substrate by injecting a silicon precursor into a chamber into which the substrate is loaded and a first purge step for removing a non-reacted silicon precursor and a reacted byproduct from the chamber; and forming the insulating film including silicon from the silicon thin film by forming a plasma atmosphere into the chamber.

11 Claims, 4 Drawing Sheets

METHOD FOR DEPOSITING CYCLIC THIN FILM

TECHNICAL FIELD

The present disclosure relates to a method of depositing a cyclic thin film and more particularly, to a method of depositing a cyclic thin film, which forms an insulating film including silicon.

BACKGROUND

With the advance of semiconductor industries and the requirements of users recently, electronic devices are being more highly integrated and have high performances, and thus semiconductor devices that are the main components of the electronic devices are also required to be highly integrated and have high performance. However, it is difficult to realize a fine structure for highly integrating semiconductor devices.

For example, a thinner insulating film is required for realizing the fine structure, but if the insulating film is formed to a thin thickness, film properties such an insulation characteristic are degraded. Also, it is becoming more difficult to form a thin film with a thin thickness while obtaining excellent step coverage.

SUMMARY

The object of the present invention is to resolve the above-mentioned problem and to provide a method of deposing an insulating film having excellent film properties and step coverage. Particularly, the present invention provides a method of depositing a cyclic thin film having excellent film properties and step coverage.

The other objects of the present invention will be more clearly understood through the following detailed description and the accompany drawings.

According to an aspect, there is provided a method of depositing a cyclic thin film comprising the steps of forming a silicon thin film by repeating a silicon deposition step for depositing silicon on a substrate by injecting a silicon precursor into a chamber into which the substrate is loaded and a first purge step for removing a non-reacted silicon precursor and a reacted byproduct from the chamber; and forming the insulating film including silicon from the silicon thin film by forming a plasma atmosphere into the chamber.

The step of forming the insulating film including silicon may comprise injecting one or more reaction gases selected from a group consisting of $O_2$, $O_3$, $N_2$, and $NH_3$.

The insulating film including silicon may be a silicon oxide film or a silicon nitride film.

The step of forming the insulating film including silicon may comprise forming the plasma atmosphere by injecting one or more ignition gases selected from a group consisting of Ar, He, Kr, and Xe.

The ignition gases may be injected at flow rate of 100 to 3000 sccm, and the reaction gases may be injected at flow rate of 10 to 500 sccm.

The step of forming the insulating film including silicon may form the plasma atmosphere using $O_2$ or $O_3$ as the ignition gas.

The method may further comprising a second purge step for removing reacted byproducts from the chamber after the step of forming the insulating film including silicon, wherein the step of forming the silicon thin film, the step of forming the insulating film including silicon and the second purge step may be repeatedly performed.

The step of forming the silicon thin film may be performed by repeating the silicon deposition step and the first purge step three or ten times.

The step of forming the silicon thin film may be performed while maintaining a pressure inside the chamber as 0.05 Torr to 10 Torr.

The step of forming the insulating film including silicon may be performed while maintaining a pressure inside the chamber as 0.05 Torr to 10 Torr.

The step of forming the silicon thin film may form the silicon thin film comprising amorphous silicon or polysilicon having polycrystalline property.

DETAILED DESCRIPTION OF EMBODIMENTS

Figure 1:
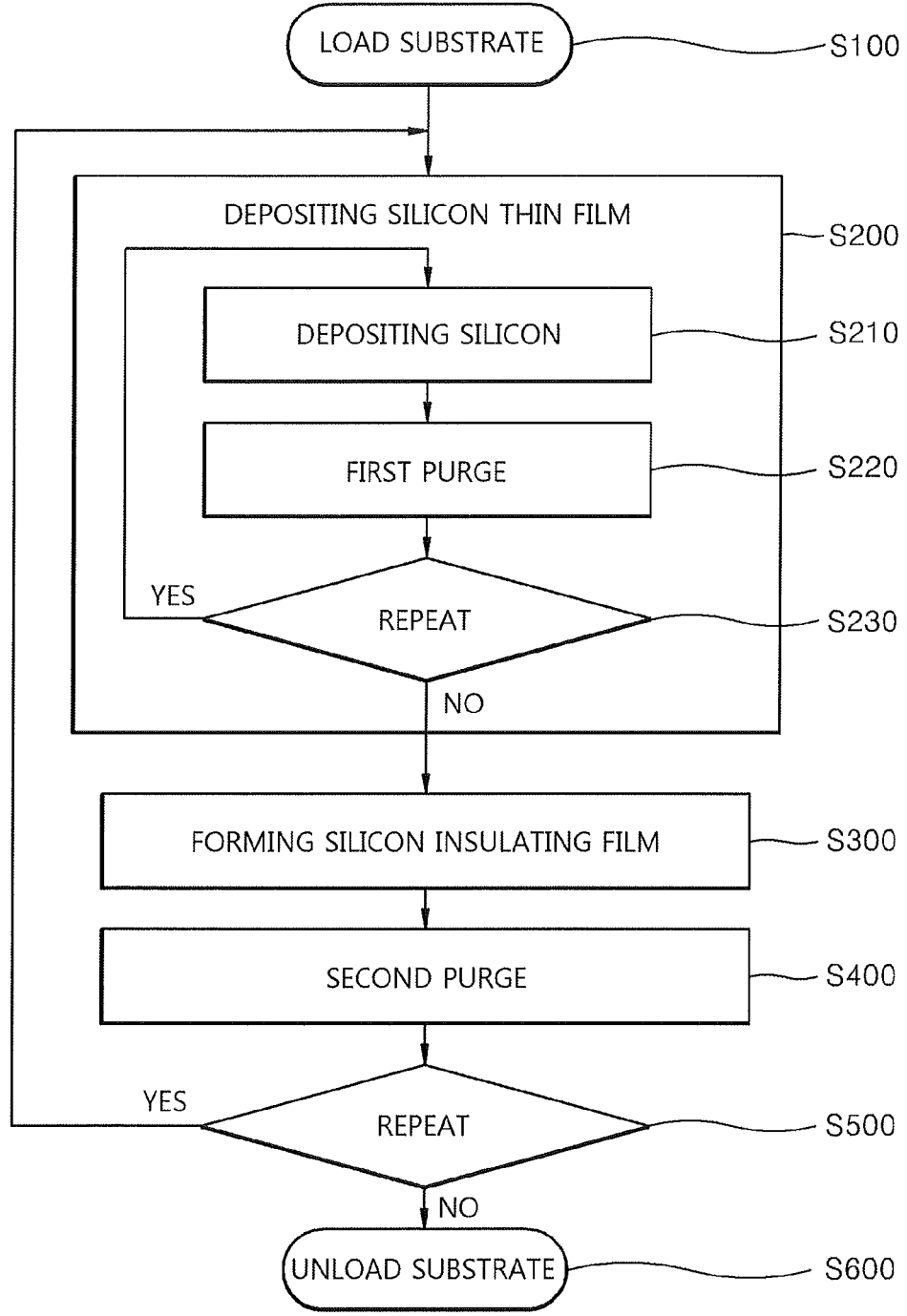
FIG. 1 is a flowchart illustrating a method of depositing a cyclic thin film according to an embodiment of the present invention.

Hereinafter, embodiments according to the inventive concept of the present invention will be described in more detail with reference to the accompanying drawings. However, embodiments of the inventive concept of the present invention may be modified in various forms, and the scope and spirit of the present invention should not be construed as being limited by the below-described embodiments. Embodiments according to the inventive concept of the present invention are provided such that those skilled in the art can more completely understand the present invention. In the accompanying drawings, like reference numeral refers to like element. Furthermore, various elements and regions in the accompanying drawings are schematically illustrated. Therefore, the present invention is not limited by relative sizes or intervals illustrated in the accompanying drawings.

FIG. 1 is a flowchart illustrating a method of depositing a cyclic thin film according to an embodiment of the present invention. Referring to FIG. 1, a substrate is loaded into a chamber of a semiconductor manufacturing apparatus S100. A silicon thin film is deposited on the substrate loaded into the chamber S200, and in the step S200, a silicon deposition step S210 and a first purge step S220 are performed together to deposit the silicon think film.

In the step S210, silicon is deposited on the substrate by injecting a silicon (Si) precursor into the chamber to deposit silicon. After silicon is deposited on the substrate, the first purge step of removing a non-reacted silicon precursor and a reaction byproduct is performed in the step S220. And then, the silicon thin film is formed on the substrate by repeating S230 the silicon deposition step S210 and the first purge step S220.

The silicon deposition step S210 and the first purge step S220 may be repeated, for example, three to ten times. In each silicon deposition step S210, one or more silicon atomic layers may be performed. Consequently, by repeatedly performing the silicon deposition step S210 and the first purge step S220, the silicon thin film comprised of amorphous silicon or polysilicon having polycrystalline property may be formed on the substrate. The silicon thin film having amorphous silicon or polycrystalline property may have a thickness of several or tens of Å.

Subsequently, an insulating film including silicon is formed from the silicon thin film formed on the substrate S300. For example, the insulating film including silicon may be a silicon oxide film or a silicon nitride film.

To form the insulating film including silicon from the silicon thin film, a reaction gas may be injected into the chamber to form plasma atmosphere inside the chamber. The reaction gas, for example, may be one or more gases selected from a group consisting of $O_2$, $O_3$, $N_2$, and $NH_3$.

If the insulating film including silicon is the silicon oxide film, the reaction gas may be a gas including an oxygen atom such as $O_2$ or $O_3$. If the insulating film including silicon is the silicon nitride film, the reaction gas may be a gas including a nitrogen atom such as $N_2$ or $NH_3$.

Alternatively, to form the insulating film including silicon, for example, the silicon oxide film from the silicon thin film, the plasma atmosphere may be formed in the chamber by using $O_2$ or $O_3$ as an ignition gas.

Alternatively, to form the insulating film including silicon, for example, the silicon nitride film from the silicon thin film, the plasma atmosphere may be formed in the chamber by using $N_2$ or $NH_3$ as an ignition gas.

Subsequently, a second purge step for removing a reacted byproduct and a reaction gas or an ignition gas from the chamber is performed in the step S400.

To obtain the insulating film including silicon having a desired thickness, the step of depositing the silicon thin film S200, the step forming the insulating film including silicon S300 and the second purge step S200 may be repeatedly performed.

When the insulating film including silicon and having the desired thickness is formed, the substrate may be unloaded from the chamber in a step S900.

Figure 2:
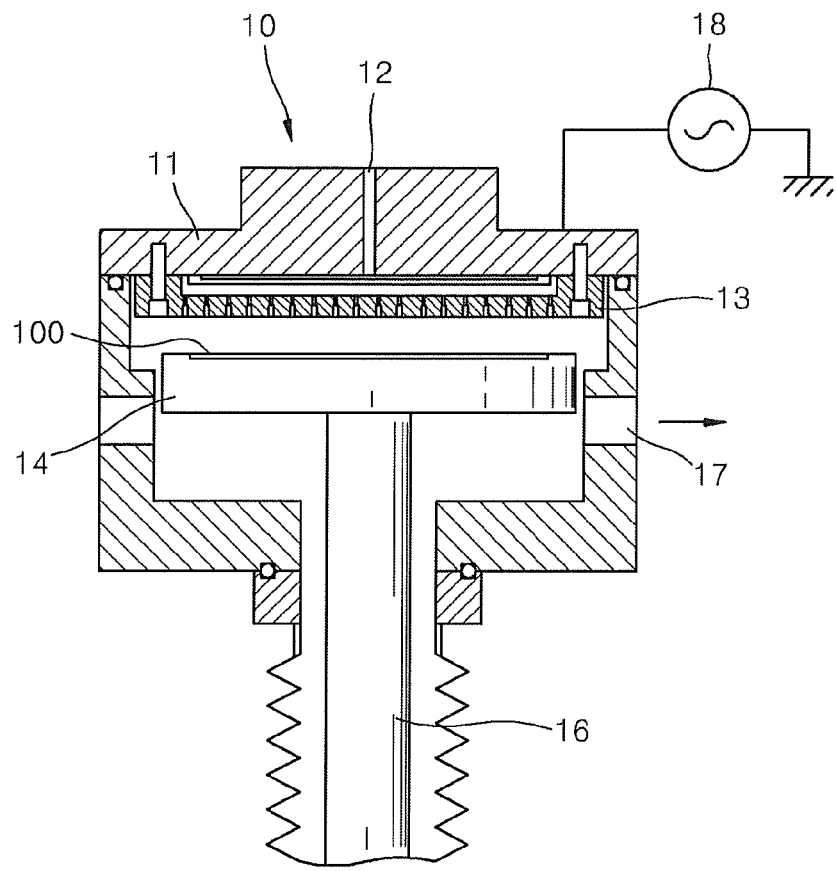
FIG. 2 is a sectional view schematically illustrating a semiconductor manufacturing apparatus for performing a method of depositing a cyclic thin film according to an embodiment of the present invention.

FIG. 2 is a sectional view schematically illustrating a semiconductor manufacturing apparatus for performing a method of depositing a cyclic thin film, according to an embodiment of the present invention. Referring to FIG. 2, and introduction part 12 for introducing a reaction gas into a chamber 11 of a semiconductor manufacturing apparatus 10 is formed. The reaction gas introduced by the introduction part 12 may be sprayed into the chamber 11 through a shower head 13.

A substrate 100 for deposition is disposed on a chuck 14, which is supported by a chuck support 16. If necessary, the chuck 14 applies heat to the substrate 100 such that the substrate 100 has a certain temperature. Deposition is performed by the semiconductor manufacturing apparatus 10 and thereafter, discharge is performed by a discharge part 17.

Moreover, to form a plasma atmosphere, the semiconductor manufacturing apparatus 10 may include a plasma generation part 18.

Figure 3:
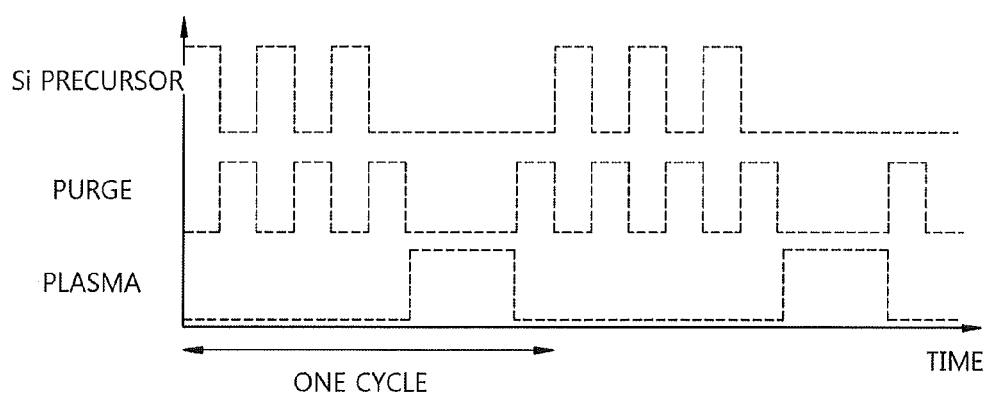
FIG. 3 is a diagram for describing a method of depositing a cyclic thin film according to an embodiment of the present invention.

FIG. 3 is a diagram describing a method of depositing a cyclic thin film according to an embodiment of the present invention. Referring to FIG. 3, the injection and purge of a silicon precursor are repeatedly performed. After the injection and purge of a silicon precursor are repeatedly performed, the plasma atmosphere is formed. In a state where the plasma atmosphere has been formed, a reaction gas may be injected as necessary.

As such, from the steps, in which the injection and purge of the silicon precursor are repeatedly performed, to the step, in which the plasma atmosphere is formed, is performed as one cycle. That is, the step of forming the insulating film including silicon by forming the plasma atmosphere after forming the silicon thin film by repeatedly performing the injection and purge of the silicon precursor is performed as one cycle.

Accordingly, the method of depositing the cyclic thin film can be performed by repeatedly performing the injection and purge of the silicon precursor as well as by repeatedly performing the steps of forming the silicon thin film and forming the insulating film including silicon.

The method of depositing the cyclic thin film according to an embodiment of the present invention will be specifically described on a step-by-step with reference to FIG. 4A to 7 based on the above description. In the following description on FIG. 4A to 7, reference numbers of FIGS. 1 to 3 may be used as necessary.

Figure 4A:
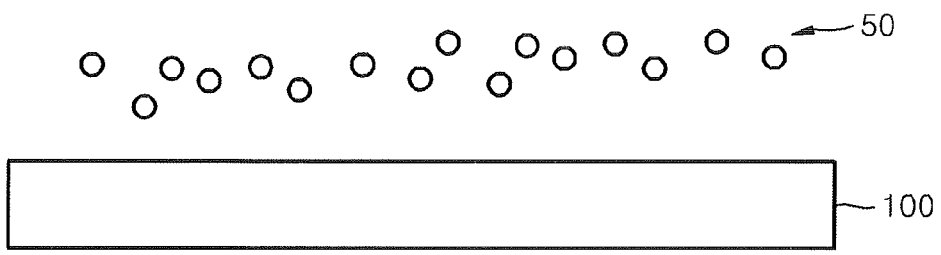
FIGS. 4A to 4C are sectional views illustrating a step of depositing silicon according to an embodiment of the present invention.
Figure 4B:
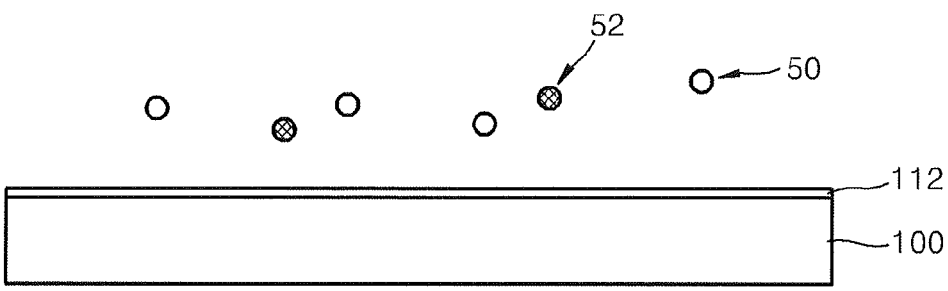
Figure 4C:

FIG. 4A to 4C are sectional views illustrating a step of depositing silicon according to an embodiment of the present invention. FIG. 4A is a sectional view illustrating a step of injecting a silicon precursor according to an embodiment of the present invention.

Referring to FIG. 4A, a silicon precursor 50 is injected into the chamber 11 into which the substrate 100 is loaded. The substrate 100, for example, may include a semiconductor substrate such as a silicon or compound semiconductor wafer. Alternatively, the substrate 100 may include a substrate material, which differs from a semiconductor, such as glass, metal, ceramic and quartz.

The silicon precursor 50, for example, may be amino-based silane such as bisethylmethylaminosilane (BEMAS), bisdimethylaminosilane (BDMAS), BEDAS, tetrakisethylmethylaminosilane (TEMAS), tetrakisidimethylaminosilane (TDMAS), and TEDAS, chloride-based silane such as hexachlorinedisilane (HCD), or silane-based precursor including silicon and hydrogen.

The substrate 100 may be maintained at a temperature of about 50° C. to about 600° C. for reacting with the silicon precursor 50. Also, a pressure inside the chamber 11 into which the substrate 100 is loaded may be maintained about 0.05 Torr to about 10 Torr.

FIG. 4B is a sectional view illustrating a step of depositing silicon on the substrate according to an embodiment of the present invention. Referring to FIG. 4B, by a portion of the silicon precursors 50 reacting with the substrate 100, a silicon atom may be deposited on the substrate 100 and thus a silicon layer 112 may be formed. The silicon layer 112 may be formed of one or more silicon atomic layer.

A portion of the silicon precursors 50 may react with the substrate 100, thereby forming byproducts 52. Also, the other portion of the silicon precursors 50 may be remained in a non-reacted state without reacting with the substrate 100.

FIG. 4C is a section view illustrating a step of performing a first purge step according to an embodiment of the present invention. Referring to FIG. 4C, the silicon layer 112 is formed on the substrate 100 and then a purge step, which removes the remaining silicon precursors 50 in a non-reacted state and the reacted byproducts 52 from the chamber 11, may be performed. The purge step, which removes the remaining silicon precursors 50 and the reacted byproducts 52 from the chamber 11, may be called as a first purge step.

In the first purge step, the substrate 100 may be maintained at a temperature of about 50° C. to about 600° C. Also, a pressure inside the chamber 11 into which the substrate 100 is loaded may be maintained about 0.05 Torr to about 10 Torr. That is, a temperature of the substrate 100 and a pressure inside the chamber 11 may be constantly maintained during the step of depositing the silicon layer 112 and the first purge step.

Figure 5:
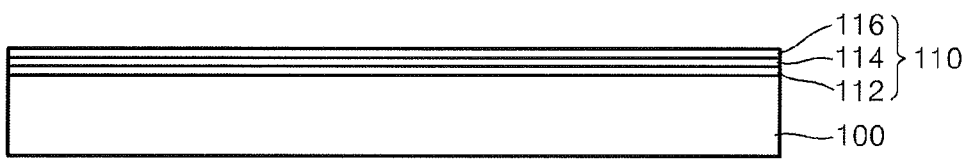
FIG. 5 is a sectional view illustrating a step of forming a silicon thin film including silicon according to an embodiment of the present invention.

FIG. 5 is a sectional view illustrating the step of depositing a silicon thin film according to an embodiment of the present invention. Referring to FIG. 5, by depositing a plurality of silicon layers 112, 114 and 116 on the substrate 100 by repeating the steps of FIG. 4A to 4C, the silicon thin film 110 comprising amorphous silicon or polysilicon having polycrystalline property is formed.

The silicon thin film 110 may have a thickness of several or tens of Å. The step of depositing the silicon thin film 110 and the first purge step may be repeatedly performed three to ten times such that the silicon thin film 110 includes three to ten silicon thin films 112, 114 and 116.

In this way, if the silicon thin film 110 is formed to include the plurality of silicon thin films 112, 114 and 116, the silicon thin film 110 can have excellent film properties and step coverage.

Figure 6A:
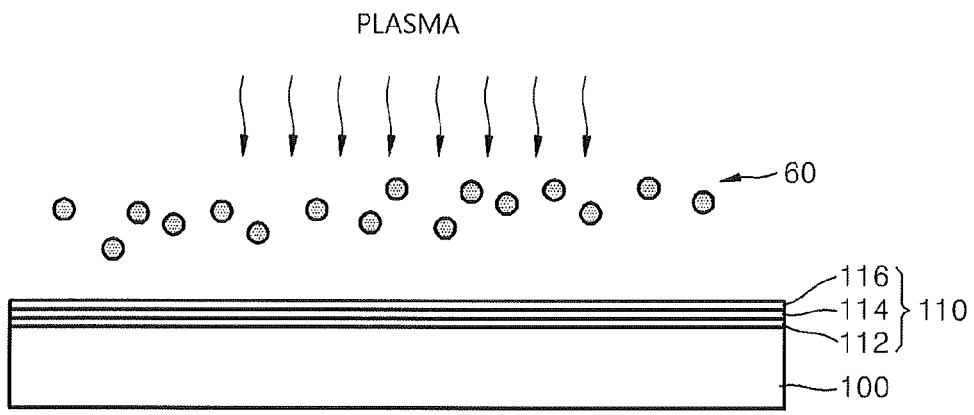
FIG. 6A is a sectional view illustrating the step of forming an insulating film including silicon from the silicon thin film according to an embodiment of the present invention.

FIG. 6A is a sectional view illustrating a step of forming an insulating film including silicon from the silicon thin film according to an embodiment of the present invention. Referring to FIG. 6A, plasma is applied onto the substrate 100 where the silicon thin film 110 is formed. That is, a plasma atmosphere is formed inside the chamber 11 into which the substrate 100 is loaded. To form the plasma atmosphere, Inductively Coupled Plasma (ICP), Capacitively Coupled Plasma (CCP) or Microwave (MW) Plasma may be used. In this time, a power of about 100 W to about 3 kW may be applied to form the plasma atmosphere.

To form the plasma atmosphere, for example, one or more ignition gases selected from a group consisting of Ar, He Kr, and Xe and, for example, one or more reaction gases 60 selected from a group consisting of $O_2$, $O_3$, $N_2$, and $NH_3$ may be injected. In this case, the ignition gas may be injected at a flow rate of about 100 sccm to about 3000 sccm.

Alternatively, to form the plasma atmosphere, one or more reaction gases 60 selected from the group consisting of $O_2$, $O_3$, $N_2$, and $NH_3$ may be injected. In this case, the reaction gases serve as the ignition gases and thus separate ignition gases may not be injected.

For example, when a gas including an oxygen atom such as $O_2$ or $O_3$ is used as the reaction gas 60, the silicon thin film 110 may react with the oxygen atom included in the reaction gas 60, thereby forming a silicon oxide film. Alternatively, when a gas including a nitrogen atom such as $N_2$ or $NH_3$ is used as the reaction gas 60, the silicon thin film 110 may react with the nitrogen atom included in the reaction gas 60, thereby forming a silicon nitride film.

To change the silicon thin film 110 into the below-described insulating film including silicon such as the silicon oxide film or silicon nitride film at the plasma atmosphere, a pressure inside the chamber 11 into which the substrate 100 is loaded may be maintained about 0.05 Torr to about 10 Torr.

Figure 6B:
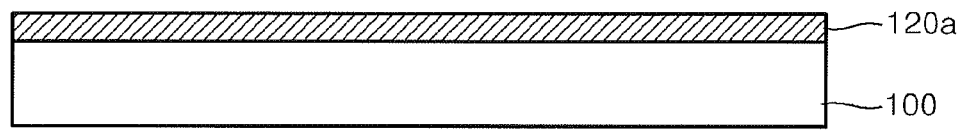
FIG. 6B is a sectional view illustrating a step of performing a second purge step according to an embodiment of the present invention.

FIG. 6B is a sectional view illustrating a second purge step including silicon according to an embodiment of the present invention. Referring to FIGS. 6A and 6B together, the insulating film including silicon 120a may be formed by performing the second purge step, which removes the remaining reaction gas and the reacted byproducts. The insulating film including silicon 120a may be, for example, a silicon oxide film or a silicon nitride film.

If the insulating film including silicon 120a such as a silicon oxide film or a silicon nitride film is formed at the plasma atmosphere, excellent film properties can be obtained. Particularly, even when the insulating film including silicon 120a is formed to have a thin thickness, the insulating film including silicon 120a can have excellent film properties.

In addition, as the above-mentioned, since the silicon thin film 110 has excellent film properties and step coverage, the insulating film including silicon 120a may have also excellent film properties and step coverage. Particularly, since the insulating film including silicon 120a is formed at the plasma atmosphere, the insulating film including silicon 102a can have more excellent film properties.

A purge step, which removes the remaining reaction gas 60 in a non-reacted state or the reacted byproducts from the chamber 11 may be called as a second purge step.

Figure 7:
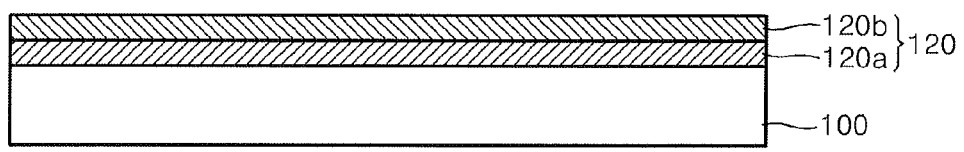
FIG. 7 is a sectional view illustrating an insulating film including silicon according to another embodiment of the present invention.

FIG. 7 is a sectional view illustrating an insulating film including silicon according to another embodiment of the present invention. Referring to FIG. 7, the insulating film 120 including a plurality of the insulating films including silicon 120a and 120b may be formed by repeating the steps described above with reference to FIGS. 4A to 6B.

If the insulating film including silicon 120a is formed from the silicon thin film 110 shown in a FIG. 6A, the silicon thin film 110 is changed to the insulating film from an exposed surface. Thus, if the silicon thin film 110 is thick, the oxide or nitrogen for reacting with the silicon thin film must be diffused through the insulating film formed on the surface of the silicon thin film. Consequently, a speed of forming the insulating film becomes slowed as the thickness of the silicon thin film 110 becomes thick.

If the insulating film 120 is relatively thick, the processing time can be reduced by repeating the step of forming the insulating film including silicon after forming a relatively thin silicon thin film, as compared with forming the insulating film from a relatively thick silicon thin film at a time.

Therefore, the number of times that the steps of FIGS. 4A to 6B are repeated may be determined in consideration of the processing time and a desired thickness of the insulating film including silicon.

Moreover, although the insulating film 120 is illustrated as including the two insulating films including silicon 120a and 120b, the insulating film 120 may include three or more insulating films including silicon.

The method of depositing the cyclic thin film according to an embodiment of the present invention can form the insulating film (for example, a silicon oxide layer or a silicon nitride layer) having excellent film properties and step coverage.

Accordingly, the insulating film with a thin thickness can be formed for realizing a highly-integrated semiconductor device and moreover since the insulating film has excellent step coverage, the fine structure can be realized. Also, since the insulating film has good film properties, the method of depositing the cyclic thin film can satisfy performance required by highly-integrated semiconductor devices.

The present invention has been described above through preferred embodiments, but the present invention may be implemented with other embodiments. Therefore, the technical spirit and scope of the below-described claims are not limited to the preferred embodiments.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalents of such metes and bounds are therefore intended to be embraced by the appended claims.

What is claimed is:

1. A method of depositing a cyclic thin film, the method comprising:
   repeating a silicon deposition step at least two times consecutively for forming a silicon thin film on a substrate, the silicon deposition step including
      injecting a silicon precursor into a chamber in which the substrate is loaded, so that a silicon layer is formed on the substrate, and
      first purging for removing a non-reacted silicon precursor and a reacted byproduct from the chamber,
   whereby the silicon thin film is formed to include a plurality of silicon layers and has excellent film properties and step coverage; and
   after repeating the silicon deposition step at least two times consecutively, performing an insulating film forming step for forming an insulating film from the silicon thin film by forming a plasma atmosphere into the chamber.

2. The method of claim 1, wherein the insulating film forming step comprises injecting one or more reacting gases selected from a group consisting of $O_2$, $O_3$, $N_2$, and $NH_3$.

3. The method of claim 2, wherein the insulating film is a silicon oxide film or a silicon nitride film.

4. The method of claim 1, wherein the insulating film is a silicon oxide film or a silicon nitride film.

5. The method of claim 1, wherein the plasma atmosphere is formed by injecting one or more ignition gases selected from a group consisting of Ar, He, Kr, and Xe.

6. The method of claim 5, wherein the ignition gases are injected at a flow rate of 100 to 3000 sccm, and the reaction gases are injected at flow a rate of 10 to 500 sccm.

7. The method of claim 1, wherein the plasma atmosphere is formed by using $O_2$ or $O_3$ as the ignition gas.

8. The method of claim 1, further comprising a second purging step for removing reacted byproducts from the chamber after the insulating film forming step, wherein the silicon deposition step, the insulating film forming step and the second purging step are repeated in order.

9. The method of claim 1, the silicon deposition step is performed while maintaining a pressure inside the chamber as 0.05 Torr to 10 Torr.

10. The method of claim 1, wherein the insulating film forming step is performed while maintaining a pressure inside the chamber as 0.05 Torr to 10 Torr.

11. The method of claim 1, wherein the silicon thin film comprises amorphous silicon or polysilicon having polycrystalline property.

* * * * *